(12) United States Patent
Ho et al.

(10) Patent No.: US 8,102,886 B1
(45) Date of Patent: Jan. 24, 2012

(54) INTEGRATED CURVED GRATING BASED SEMICONDUCTOR LASER

(75) Inventors: Seng-Tiong Ho, Wheeling, IL (US); Yingyan Huang, Wilmette, IL (US)

(73) Assignee: Optonet Inc., Evanston, IL (US)

( * ) Notice: Subject to any disclaimer, the term of this patent is extended or adjusted under 35 U.S.C. 154(b) by 0 days.

(21) Appl. No.: 12/386,817

(22) Filed: Apr. 23, 2009

(51) Int. Cl.
*H01S 3/10* (2006.01)

(52) U.S. Cl. .......................................... 372/20
(58) Field of Classification Search ............ 372/20
See application file for complete search history.

(56) References Cited

U.S. PATENT DOCUMENTS

| 5,052,013 | A  | * | 9/1991 | Putnam | 372/97 |
| 7,565,084 | B1 | * | 7/2009 | Wach | 398/201 |
| 2004/0165639 | A1 | * | 8/2004 | Lang et al. | 372/92 |
| 2005/0207464 | A1 | * | 9/2005 | Blauvelt et al. | 372/64 |
| 2006/0198398 | A1 | * | 9/2006 | Fermann et al. | 372/6 |
| 2007/0098324 | A1 | * | 5/2007 | Kitamura et al. | 385/37 |
| 2007/0195849 | A1 | * | 8/2007 | Takagi et al. | 372/50.11 |

* cited by examiner

*Primary Examiner* — Patrick Stafford
(74) *Attorney, Agent, or Firm* — William L. Botjer (57) ABSTRACT

A wavelength tunable laser which includes a first mirror, a diffraction grating to diffract a laser beam into a plurality of diffracted laser beams, at least one feedback waveguide, at least one second mirror. Each feedback waveguide precedes one of the second mirrors, and a phase detector to detect an error in a wavelength of a received laser beam with respect to a desired wavelength.

29 Claims, 9 Drawing Sheets

INTEGRATED CURVED GRATING BASED SEMICONDUCTOR LASER

BACKGROUND

The present invention relates in general to a laser device, and more particularly, to a wavelength tunable laser device.

In recent years, there has been a dramatic increase in demand for communication systems involving communication networks, such as dense wavelength division multiplexing (DWDM) networks, dynamic routing and packet switching networks, Coarse wavelength division multiplexing (CWDM) networks, and analog photonics. These communication networks are generally based on optical technologies using optical fiber as a communicating medium and therefore known as optical communication networks. In optical communication networks, data is communicated or transmitted through an optical fiber medium as laser beams at different wavelengths. The wavelength of the laser beams that is used to transmit data can be selected from a wide range of wavelengths for the optical communication networks. For such networks, a wavelength tunable laser device is desired that can select and tune a laser beam to a desired wavelength among the wide range of wavelengths.

Currently, various laser devices capable of providing a wavelength tunable laser are available. One such laser device is the Sampled-Grating DBR (SGDBR) laser. The SGDBR laser includes monolithic integration with a front and back Bragg grating, known as distributed Bragg reflector (DBR), a phase section, and a gain section. In this laser, currents are injected into the front and back grating sections for wavelength tuning. The phase section is used to control the phase of the laser by using the error signal that is generated using the correlation between the output power and the cavity-mode frequency offset. The phase control in the SGDBR is required to reduce the cavity-mode frequency offset to zero. Another laser device used for wavelength tuning is a microelectromechanical tunable external cavity laser (MEM-ECL). In this laser, a microelectromechanical (MEM) device is used to tune a mirror in front of an intra-cavity diffraction grating for wavelength tuning. The phase control of the laser beam is performed by using a piezoelectric transducer (PZT) on the mirror, using the error signal that is generated utilizing the correlation between the output power and the cavity-mode frequency offset. Apart from SGDBR and MEM-ECL, the tunable filter external cavity laser (TF-ECL) is also used for wavelength tuning. The TF-ECL uses an intra-cavity tunable filter for wavelength tuning. In TF-ECL, similar to MEM-ECL, the phase control of the laser beam is performed by using a PZT on the mirror.

All of the laser devices described above has their shortcomings. In the case of the SGDBR laser, the power consumption of the laser module is high. The currents required for the front and back grating sections are typically around 150 mA each. In addition, 100 mA of current is required for the gain section, resulting in a high operating current of 500 mA (approx.) The power consumption of the laser module is also increased by the use of a thermoelectric cooler (TEC) to cool the chip in a packaged module. As a result, high power (approx. 10 W) is required to feed the laser module. Therefore, the SGDBR is a power-consuming laser device and not economical.

Another shortcoming of the SGDBR laser is its difficulty to detect the cavity-mode frequency offset, which is required for the phase control of the laser, in order to optimize the performance of the laser. The phase of the laser beam is controlled by using the correlation between the cavity-mode frequency offset and the laser output power. The cavity-mode frequency offset falls to zero when the power/voltage is at a local maximal/minimal. Therefore, to lock the cavity-mode frequency offset at zero, the SGDBR laser involves dithering the gain section's injection current and using the phase-sensitive lock-in technique to lock to local power peak/dip by feeding back to the phase section. This phase-sensitive lock-in technique requires two lock-in amplifiers and various feedback loops controlled by an on-board microprocessor. The overall structure therefore results in a complex laser control circuit and increases the cost of SGDBR.

The MEM-ECL laser also includes the complex control circuit to control the MEM mirror tuning and the phase control of the laser. The packaging cost of the MEM-ECL is also high due to the alignment requirement of micro-optic components. The TF-ECL laser eliminates the complex circuitry required for wavelength tuning but still requires a complex control circuit for phase section control. Furthermore, TF-ECL generally takes around 25 seconds for wavelength tuning, which is longer than that of the MEM-ECL and SGDBR laser devices.

In light of the drawbacks of the known laser devices mentioned above, there is a need for a wavelength tunable laser that requires low operating current and power, and has a simple control circuit for phase control and wavelength tuning. The laser device should also have a high wavelength tuning speed.

SUMMARY

An object of the present invention is to provide a method and system for a wavelength tunable laser device with a wide tunability range.

Another object of the present invention is to provide a method and system for error detection and generation to nullify the cavity-mode frequency offset to zero, without involving complex circuitry.

Still another object of the present invention is to reduce the high operating current and power required for wavelength tuning of a laser.

Yet another object of the present invention is to improve the functionality of a laser with low costs.

Yet another object of the present invention is to provide a method and system for a wavelength tunable laser device with high tuning speed. To achieve the foregoing objects, and in accordance with the purpose of the present invention as broadly described herein, the present invention provides a wavelength tunable laser.

The present invention provides a wavelength tunable laser device. The device includes a first mirror. Further, the device includes a diffraction grating to diffract a laser beam into a plurality of diffracted laser beams. Each of the plurality of diffracted laser beams of specific wavelengths is diffracted to specific spatial directions. Furthermore, the device includes at least one feedback waveguide. A feedback waveguide is spatially present in a specific direction corresponding to the specific spatial direction of a diffracted laser beam of the plurality of diffracted laser beams. In addition, the feedback waveguide is selected to receive the diffracted laser beam. The wavelength tunable laser device also includes at least one second mirror. Each feedback waveguide precedes a second mirror and the second mirror reflecting the diffracted laser beam. Furthermore, the wavelength tunable laser device includes a phase detector to detect an error in a wavelength of a received laser beam with respect to a desired wavelength. The phase detector generates an error signal to identify the error in the wavelength of the received laser beam.

Another embodiment of the present invention provides a wavelength tunable laser device. The wavelength tunable laser device includes a first mirror. Further, the wavelength tunable laser device includes a diffraction grating to diffract a laser beam into a specific direction. Furthermore, the wavelength tunable laser device includes at least one gain waveguide. A gain waveguide is spatially present in a specific direction, and the gain waveguide is selected to transmit the laser beam. Moreover, the wavelength tunable laser device includes at least one second mirror, wherein each gain waveguide precedes a second mirror and the second mirror reflecting a received laser beam. Furthermore, the wavelength tunable laser device includes a plurality of phase detectors. A phase detector of the plurality of phase detectors detects an error in a wavelength of the received laser beam with respect to a desired wavelength. The phase detector also generates an error signal to identify the error in the wavelength of the received laser beam.

Another embodiment of the present invention provides a method for tuning a laser to a specific wavelength. The method includes receiving a laser beam from a laser source. The method also includes diffracting the laser beam into a plurality of diffracted laser beams. The plurality of diffracted laser beams of specific wavelengths is diffracted to specific spatial directions. Further, the method includes selecting a diffracted laser beam of the plurality of diffracted laser beams to form a received laser beam. Furthermore, the method includes detecting an error in a wavelength of the received laser beam with respect to a desired wavelength. In addition, the method includes providing an output laser beam of the desired wavelength.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DETAILED DESCRIPTION OF THE DRAWINGS

A Light Amplification by Stimulated Emission of Radiation (laser) device emits a beam that is narrow and has low divergence. The laser device includes an optical cavity formed between two mirrors arranged in such a way that light bounces back and forth between the two mirrors. Typically, one of the two mirrors is partially transparent to emit an output laser beam. The optical cavity of the laser includes a gain medium that enables the laser to amplify light by stimulated emission. When energy is supplied to the gain medium, some electrons of the gain medium absorb the energy and jump into a higher-energy or excited quantum states. The excited electrons can then emit photons, releasing the extra energy absorbed. The excited electrons of the gain medium can interact with the emitted photons to emit more photons of the same wavelength and the same phase. These photons propagate between the two mirrors and can be transmitted through the partially transmitted mirror as the output laser beam. If the gain of the photon is larger than the total loss in one single pass through the cavity, lasing will occur. For a semiconductor based tunable laser to work, for example, the gain medium will consist of semiconductor material, which when pumped by electrical current, will provide gain with a broad width of ~20-200 nm at ~1550 center wavelength. Depending on the total length of the cavity, certain Fabry-Perot modes will exist for which the optical field will be constructively interfered inside the cavity, if the total other loss is low enough, those Fabry-Perot modes will lase.

If we introduce another filter into the cavity, only the Fabry-Perot modes inside the filter pass band will be able to pass through and lase, all the rest of the Fabry-Perot modes will experience high loss and will not lase. If only one Fabry-Perot mode exist in the filter band, then the laser can achieve single frequency (or single wavelength) mode operation.

The wavelengths of the Fabry-Perot modes are controlled by the cavity length and may not coincide with the peak of the filter band. In that case, what will happen is called "frequency pulling" to those skilled in the art, in which the lasing wavelength is neither at the filter peak wavelength nor the Fabry-Perot mode wavelength, instead, it is a wavelength in between the two. The distance between the Fabry-Perot mode and the filter band peak is referred to as the cavity-mode frequency offset. The larger the cavity-mode frequency offset, the worse the performance of the laser. It is thus necessary to have a mechanism to detect the cavity-mode frequency offset. It is also necessary to have a mechanism to tune the cavity-mode frequency offset to zero.

In order to tune the lasing wavelength of the laser, we can change the filter band peak to different wavelengths, while maintaining the same gain medium so the broad gain curve can be utilized.

At present, laser devices are used over a wide number of applications, such as optical storage devices, fiber-optic communication, and therapeutic applications. Laser devices are also used in manufacturing process for cutting, bending, and welding metal and other materials.

Figure 1:
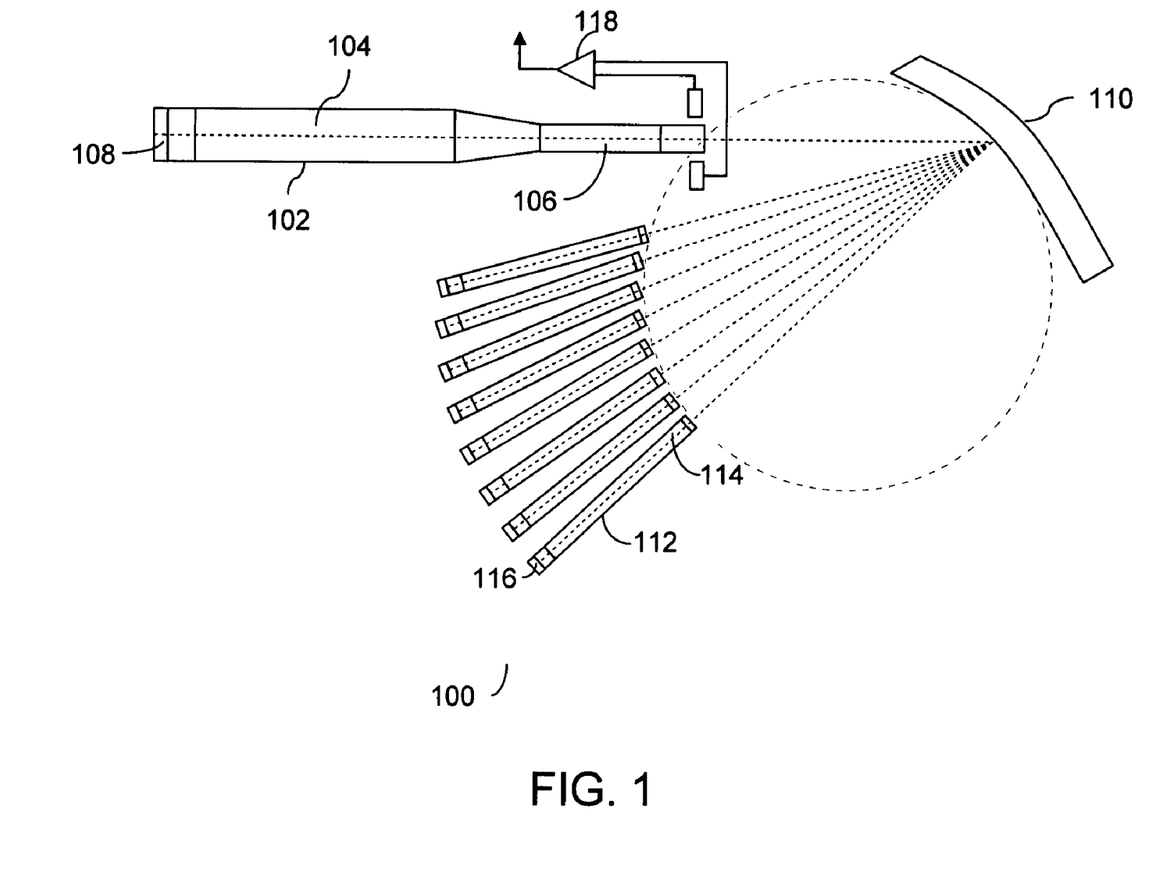
FIG. 1 is a diagram of a wavelength tunable laser, in accordance with an exemplary embodiment of the invention.

FIG. 1 is a diagram of a wavelength tunable laser 100, in accordance with an exemplary embodiment of the invention. In one embodiment of the present invention, wavelength tunable laser 100 is a monolithically integrated laser, based on the chip-scale wavelength division multiplexing (WDM) technology with nanosecond tuning speed. The monolithically integrated laser is more robust than the hybrid integrated laser, wherein individual components are tediously aligned and attached to the hybrid integrated laser. The types of substrate that the wavelength tunable laser 100 can be fabricated on include various types of semiconductors, for example, InP, GaAs, GaN, Silicon, etc. the gain can be provided by bulk semiconductor, quantum well, or quantum dots, or other amplifying media. A laser beam is confined to propagate within a plane parallel to the substrate. In the vertical direction, the laser beam is guided within a planer or a channel waveguide structure consisting of a high refractive index core surrounded by low refractive index cladding above and below the core as is well known to those skilled in the art. In another exemplary embodiment of the present invention, Wavelength tunable laser 100 is also enclosed in a temperature-controlled airtight module, which enables thermal tuning of a laser beam wavelength as well as ensuring the constant temperature of the laser chip when one particular wavelength is chosen. Thermal tuning of the laser beam wavelength is performed by changing the temperature of the laser chip and thus changing the refractive index of the semiconductor substrate. In one embodiment, the temperature tuning rate of wavelength tunable laser 100 is 0.12 nm/° C., i.e., the laser beam can be tuned over a 0.12 nm wavelength range by changing the temperature of wavelength tunable laser 100 by one degree Celsius.

Wavelength tunable laser 100 includes a gain waveguide 102. Gain waveguide 102 can be an optical waveguide formed on the aforementioned semiconductor substrate by using wet or dry etching of the material. Gain waveguide 102 includes a gain amplifying section 104 and a phase-shifting section 106. Gain waveguide 102 precedes a first mirror 108, which can reflect the laser beam. In one embodiment, first mirror 108 can be a metal-coated reflector that can reflect the laser beam. In one embodiment, first mirror 108 can be a dielectric coated reflector that can not only reflect the laser beam but also emit the laser beam as an output laser beam. In yet another embodiment, first mirror 108 is a wafer-cleaved facet that can not only reflect the laser beam but also emit the laser beam as an output laser beam. In yet another embodiment, first mirror 108 can be an etched Distributed Bragg Grating reflector that can not only reflect the laser beam but also emit the laser beam as an output laser beam. In a general embodiment, first mirror 108 can be any device to reflect the laser beam back as is known to those skilled in the art. The laser beam reflected by first mirror 108 propagates to gain amplifying section 104 of gain waveguide 102. Gain amplifying section 104 provides optical gain to the laser beam by amplifying the laser beam. Gain amplifying section 104 requires electric current injection to amplify the laser beam. The laser beam reflected from first mirror 108, passing through gain amplifying section 104, propagates to a diffraction grating 110. Diffraction grating 110 is used to diffract the laser beam into a plurality of diffracted laser beams. A diffracted laser beam of a specific wavelength is diffracted to a specific spatial direction by diffraction grating 110. In one embodiment, diffraction grating 110 is in the shape of a concave curve. It can be fabricated by vertical etching into the side wall of a waveguide on a semiconductor chip resulting in an integrated curved diffraction grating. The curved grating of diffraction grating 110 can be any integrated diffraction grating as is known to those skilled in the art. In one embodiment, the curve grating of diffraction grating 110 is computationally generated with full spatial aberration correction. The spatial aberration correction enables the curved grating to diffract the laser beams at a large diffraction angle without spatial aberration. For example, the laser beams can be diffracted at diffracting angles as large as 50° without any spatial aberration. This results in super-high spatial resolution for grating dispersion of the laser beam. Therefore, a super-high wavelength resolution can be achieved by diffraction grating 110 at a small physical size of up to 1 mm. Diffraction grating 110 can also be referred to as Super-High-Resolution Compact Curved Grating (SCG). In one embodiment, the diffraction grating 110 is the SCG described in patents "Curved grating spectrometer, U.S. Pat. No. 7,283,233" and "Integrated signal manipulator for manipulating optical signals, application Ser. No. 11/451,797," and are hereby incorporated by reference.

Wavelength tunable laser 100 includes at least one feedback waveguide 112. In one embodiment, laser 100 includes one feedback waveguide 112. In another embodiment, laser 100 includes more than one feedback waveguide 112. Feedback waveguide 112 is spatially present in a specific direction corresponding to the specific spatial direction of the diffracted laser beam of the plurality of diffracted laser beams. After the laser beam has been diffracted by diffraction grating 110, the diffracted laser beam propagates to feedback waveguide 112. In one embodiment, feedback waveguide 112 can be an optical waveguide formed on the semiconductor substrate by wet or dry etching of the material. In one embodiment, feedback waveguide 112 includes an absorber section 114 that can be pumped to or above transparency, enabling the diffracted laser beam to propagate through feedback waveguide 112.

Wavelength tunable laser 100 also includes at least one second mirror 116, wherein feedback waveguide 112 precedes second mirror 116. In one embodiment, second mirror 116 can be a reflector formed by etching of the substrate vertically. In another embodiment second mirror 116 can be a metal-coated reflector formed by etching the substrate vertically and coated with a high reflectivity metal. In another embodiment, second mirror 116 can be a dielectric-coated reflector formed by etching the substrate vertically and coated with single or multiple high reflectivity dielectric materials. In a general embodiment, second mirror 116 can be any device to reflect the laser beam back as is known to those skilled in the art. After the diffracted laser beam propagates through feedback waveguide 112 (when absorber section 114 is pumped to transparency or gain), the diffracted laser beam is reflected by second mirror 116 to diffraction grating 110 as a reflected laser beam. Diffraction grating 110 diffracts the reflected laser beam to gain waveguide 102. The reflected laser beam then enters gain waveguide 102 as a received laser beam. In order for the tunable laser to lase well, apart from the requirement that the reflected laser beam needs to be able to enter the gain waveguide 102 so lasing cavity is formed between first mirror 108 and second mirror 116, the wavelength of the laser beam also needs to be on resonance with the Fabry-Perot resonance wavelength (referred to as the cavity-mode wavelength) of the whole cavity formed in between first mirror 108 and second mirror 116. This requirement is not met automatically so tuning of the cavity-mode wavelength is necessary. Usually the cavity-mode wavelength is different from the wavelength of the reflected laser beam, which results in the cavity-mode frequency offset between these two wavelengths. A phase detector 118 detects the cavity-mode frequency offset and then sends an error signal to phase-shifting section 106. Phase-shifting section 106 can shift the phase of a received laser beam to nullify the cavity-mode frequency offset, based on the error signal received from phase detector 118. After propagating through phase-shifting section 106, the received laser beam passes through gain amplifying section 104 and then to first mirror 108. Therefore, a laser cavity is formed between first mirror 108 and second mirror 116 for laser propagation and wavelength tuning of the laser beam.

Figure 2:
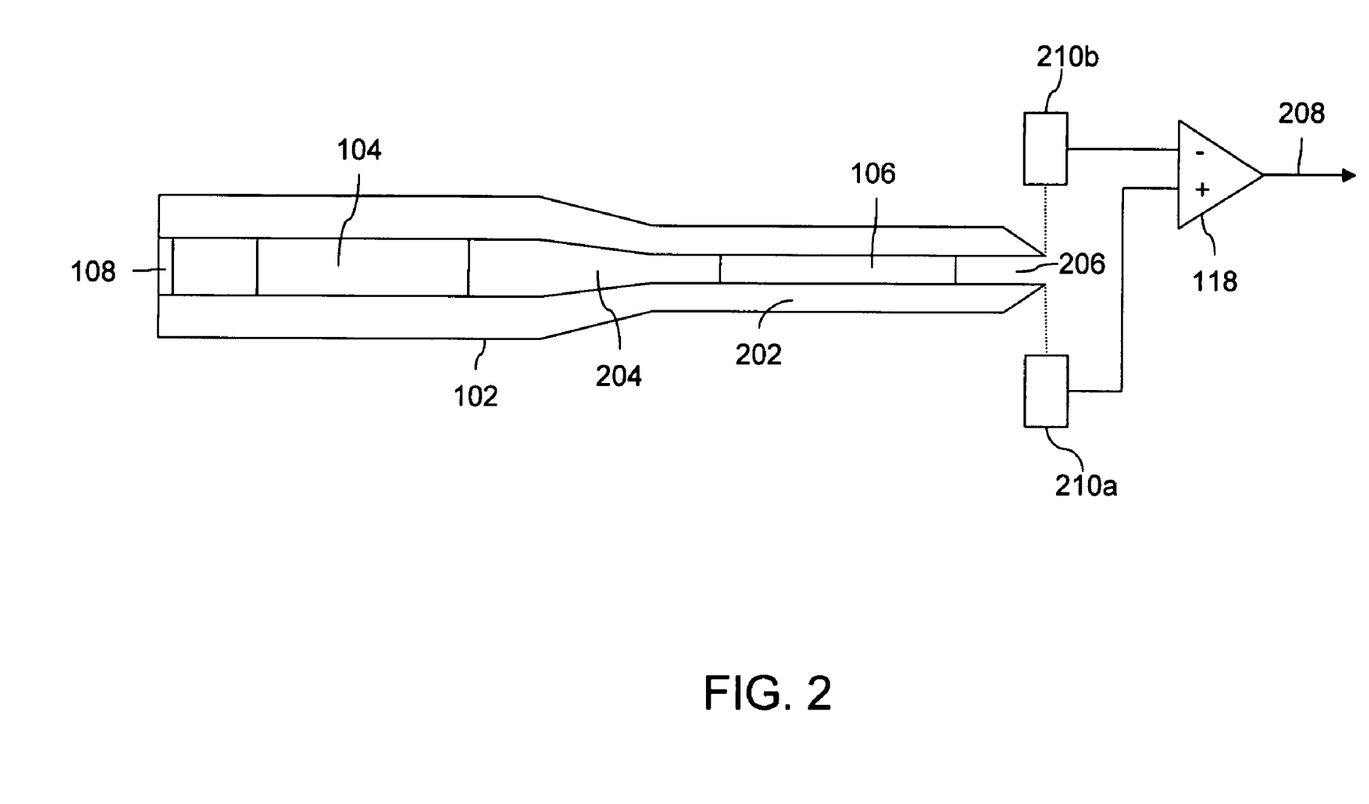
FIG. 2 is a diagram of a gain waveguide of the wavelength tunable laser, along with a phase detector, in accordance with an exemplary embodiment of the invention.

FIG. 2 is a diagram of gain waveguide 102 of wavelength tunable laser 100 along with phase detector 118, in accordance with an exemplary embodiment of the invention. The core of gain waveguide 102 includes gain amplifying section 104 and phase-shifting section 106. Gain amplifying section 104 and phase-shifting section 106 require an active medium at which electrical current, field, or energy can be applied to it. In one embodiment, electric current is injected into gain amplifying section 104 and phase-shifting section 106, thereby enabling them to perform their functions. In one embodiment, gain amplifying section 104 requires 50 mA of current, and phase-shifting section 106 requires 10 mA of current.

Gain amplifying section 104 amplifies the laser beam and acts as an optical gain medium that provides optical gain to the laser beam. Phase-shifting section 106 is used to shift the phase of a received laser beam and to nullify the cavity-mode frequency offset present in the received laser beam. In one embodiment, various methods known to those skilled in the art to supply energy to the gain medium 104 to achieve optical can be used, which include but are not limited to current injection via a semiconductor diode PN junction. In a general embodiment, various methods known to those skilled in the art to electrically change the phase for the optical beam propagating though the phase section 106 can be used, which include but are not limited to free-carrier density induced refractive index change due to an injected current or refractive index change induced by an externally applied electrical field as is well known to those skilled in the art.

The final lasing wavelength of wavelength tunable laser 100 depends on two wavelengths (or frequencies). One of the wavelengths is the received laser beam from the diffraction grating. The reflected laser beam is a laser beam that is reflected by second mirror 116 and then diffracted back to gain waveguide 102 by diffraction grating 110. The wavelength of the reflected laser beam corresponds to a wavelength that is desired from the output laser beam of wavelength tunable laser 100. Hereinafter, this wavelength is referred to as a desired wavelength. The other wavelength is referred to as a cavity-mode wavelength and is generated due to the Fabry-Perot resonance phenomenon. The cavity-mode wavelength is typically different from the desired wavelength and therefore results in a cavity-mode frequency offset between the received laser beams of these two different wavelengths.

The cavity-mode wavelength of the received laser beam is dependent on the cavity length of gain waveguide 102. The cavity length of gain waveguide 102 can be altered by varying the length of phase-shifting section 106. When electric current is injected into phase-shifting section 106, the carrier density change from the injection current results in an optical phase shift of up to $2\pi$ in the cavity-mode wavelength of the received laser beam. To reduce the cavity-mode frequency offset to zero, the phase of the received laser beam of the cavity-mode wavelength is shifted. As a result, the received laser beam of the cavity-mode wavelength is aligned with the received laser beam of the desired wavelength. Therefore, by shifting the phase of the received laser beam of the cavity-mode wavelength by phase-shifting section 106 nullifies the cavity-mode frequency offset in the received laser beam. In one embodiment, phase-shifting section 106 of 80 μm length will be required to achieve a $\pi$ phase shift with a high phase-shifting speed of around 10 nsec.

In one embodiment, the core of gain waveguide 102 is surrounded with a cladding 202 on both sides in a horizontal direction parallel to the plane of the substrate. In one embodiment, the core can be formed of Silicon Dioxide ($SiO_2$). Cladding 202 is etched trench to provide the refractive index contrast needed to form the optical waveguide. In one embodiment, cladding 202 can be formed of Silicon Dioxide ($SiO_2$), Silicon Nitride ($Si_3N_4$) or Benzocyclobutene (BCB) material having refractive indices in the range of 1.5 to 1.9. In one embodiment, a tapered down region 204 is formed on gain waveguide 102 to prevent a high-order transverse mode of propagation for the laser beam. Tapered down region 204 acts as a single-mode spatial filter, which enables the laser beam to only propagate in the lowest-order transverse mode. The mouth of gain waveguide 102 at one of its ends acts as a slit 206. Slit 206 enables the laser beam to exit gain waveguide 102 and the received laser beam to enter gain waveguide 102.

To maintain the cavity-mode frequency offset at zero, the cavity-mode frequency offset needs to be detected, so that it can be used in a feedback control loop of phase-shifting section 106 to nullify the cavity-mode frequency offset. Phase detector 118 is used to detect the error in the wavelength of the received laser beam with respect to the desired wavelength. In one embodiment, phase detector 118 generates an error signal 208 to identify the error in the wavelength of the received laser beam and provide it to phase-shifting section 106 for feedback control of its injection current. Phase detector 118 includes a pair of detectors 210a and 210b that are placed at equal distance from slit 206. In one embodiment, slit 206 can act as a beam splitter that can reflect a small percentage of the received beam to pair of detectors 210a and 210b of phase detector 118. Error signal 208 generated by phase detector 118 is proportional to the cavity-mode frequency offset. This error signal 208 can be feedback to phase-shifting section 106, to nullify the cavity-mode frequency offset.

Figure 3:
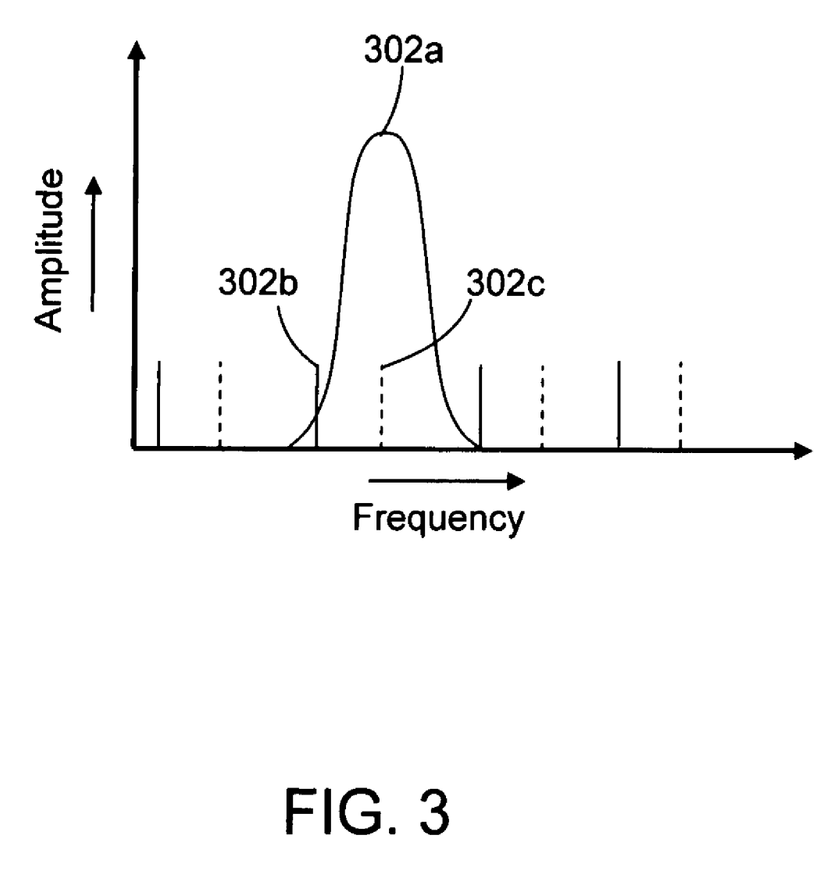
FIG. 3 is a graph illustrating a cavity-mode frequency offset, in accordance with an exemplary embodiment of the invention.

FIG. 3 is a graph illustrating the cavity-mode frequency offset, in accordance with an exemplary embodiment of the invention. Curve 302 is a curve of the diffraction grating passband. The received laser beam having the cavity-mode wavelength is generated due to the Fabry-Perot resonance phenomenon occurring in the cavity formed in wavelength tunable laser 100. The cavity-mode wavelength is different from the desired wavelength and therefore results in a cavity-mode frequency offset between the received laser beams of these two different wavelengths. Phase-shifting section 106 aligns one of the Fabry Perot resonance peaks 302b with the peak of curve 302a of the grating passband. Phase-shifting section 106 aligns the Fabry Perot resonance peak 302b with the peak of curve 302a by shifting the phase of the received laser beam of the cavity-mode wavelength, as described in conjunction with FIG. 2. As a result of phase shifting of the Fabry Perot resonance peak 302b is shifted to 302c, aligning with the peak of curve 302a, the cavity-mode frequency offset is nullified.

Figure 4:
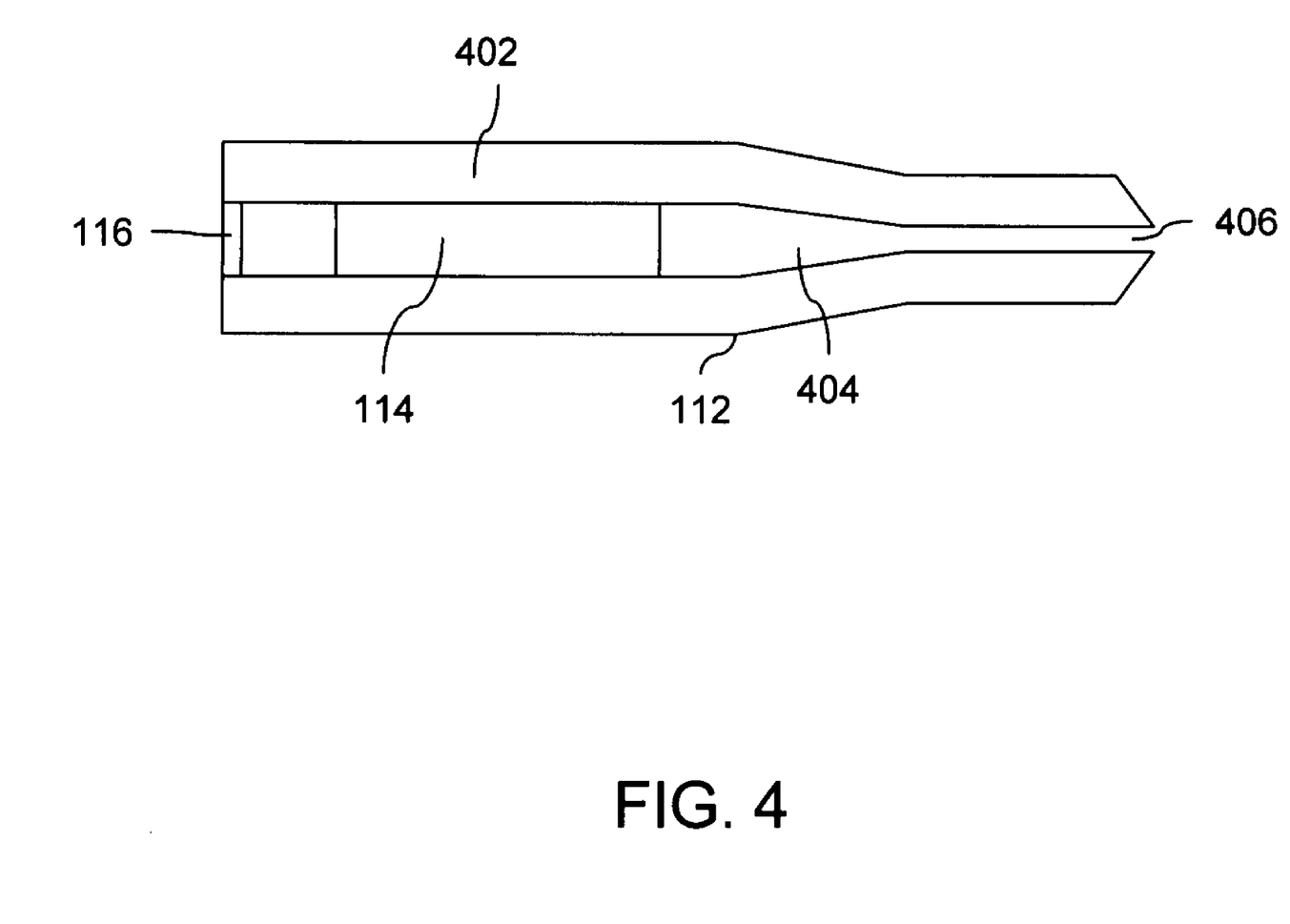
FIG. 4 is a diagram of a feedback waveguide, in accordance with an exemplary embodiment of the invention.

FIG. 4 is a diagram of feedback waveguide 112, in accordance with an exemplary embodiment of the invention. The core of feedback waveguide 112 includes absorber section 114. Feedback waveguide 112 is a lossy medium for the propagation of the diffracted laser beam. By pumping absorber section 114 to transparency or gain, the lossy characteristic of feedback waveguide 112 ceases, thereby enabling propagation of the diffracted laser beam through feedback waveguide 112. Absorber section 114 requires electric current injection to pump it to transparency or gain. In one embodiment, absorber section 114 requires 10 mA of current to pump it to transparency. Further, in another embodiment, the length of absorber section 114 can be in the range of 25 to 200 μm.

In one embodiment, the core of absorber section 114 is surrounded with a cladding 402 on both sides. The core can be formed of Silicon Dioxide ($SiO_2$). In one embodiment, Cladding 402 is a deeply etched air trench of 1-μm width. In one embodiment, cladding 402 can be formed of $SiO_2$ or $Si_3N_4$ or BCB material having refractive indices in the range of 1.5 to 1.9. In one embodiment, a tapered down region 404 is formed on feedback waveguide 112 to prevent high-order transverse mode of propagation for the diffracted laser beam. Tapered down region 404 acts as a single-mode spatial filter that enables the diffracted laser beam to only propagate in the lowest-order transverse mode. The mouth of absorber section 114 at one of its ends acts as a slit 406. In one embodiment, slit 406 enables the diffracted laser beam to enter gain waveguide 102 and the reflected laser beam to exit gain waveguide 102.

Figure 5:
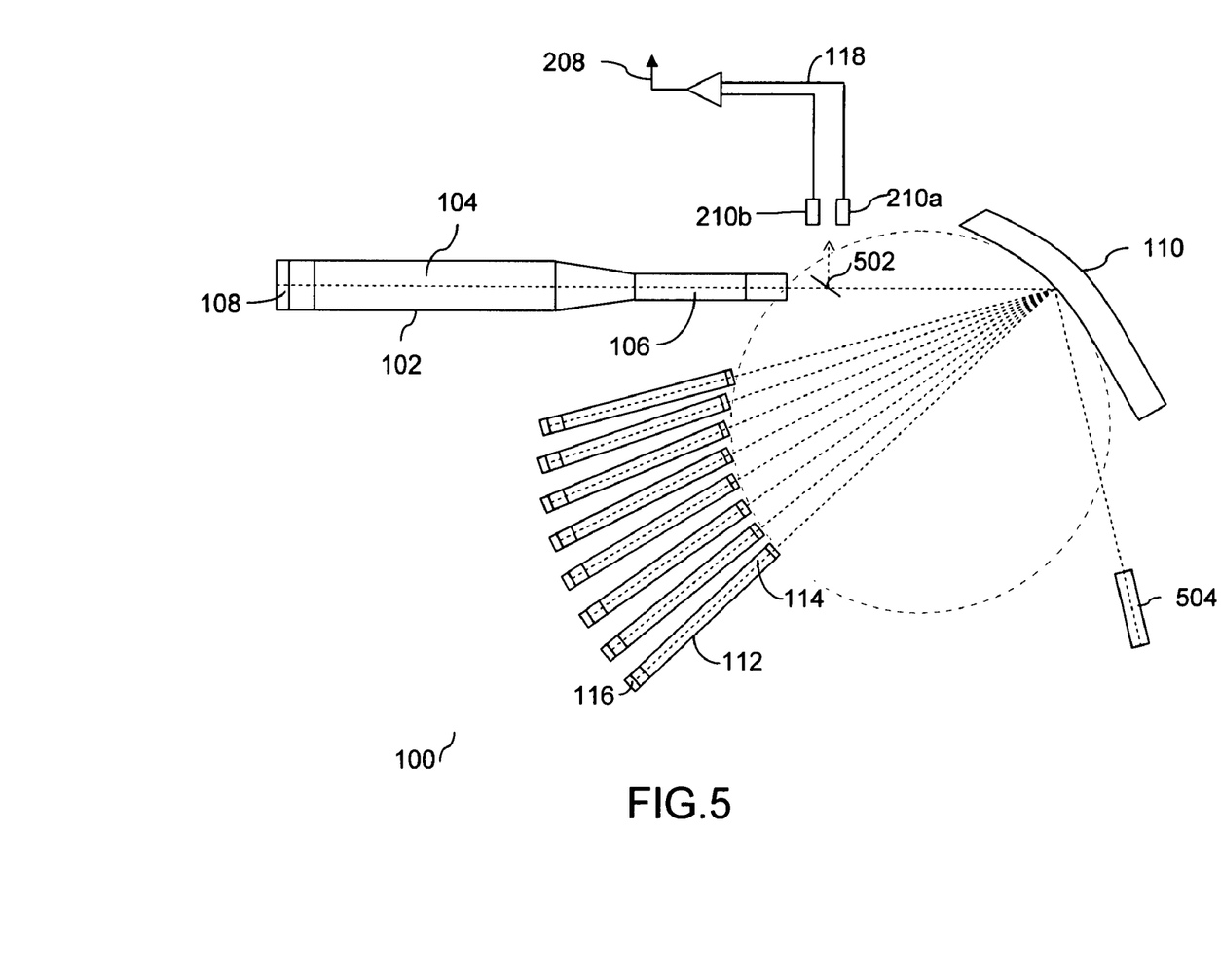
FIG. 5 is another diagram of a wavelength tunable laser, in accordance with an exemplary embodiment of the invention.

FIG. 5 is another diagram of wavelength tunable laser 100, in accordance with an exemplary embodiment of the invention. Wavelength tunable laser 100 is a monolithically integrated laser, based on the chip-scale WDM technology with nanosecond tuning speed. Wavelength tunable laser 100 can be fabricated on a single InP semiconductor chip. Phase-shifting section 106 can shift the phase of the received laser beam to nullify any cavity-mode frequency offset, based on error signal 208 received from phase detector 118. Phase detector 118 includes pair of detectors 210a and 210b that is placed at equal distance from a beam splitter 502. Beam splitter 502 can reflect a small percentage of the received beam to pair of detectors 210a and 210b of phase detector 118. Error signal 208 generated by the phase detector is proportional to the cavity-mode frequency offset. This error signal 208 can be feedback to phase-shifting section 106, to nullify the cavity-mode frequency offset.

Gain waveguide 102 precedes first mirror 108, which can reflect a laser beam. In one embodiment, first mirror 108 is a wafer-cleaved facet that can provide an output laser beam. In another embodiment, wavelength tunable laser 100 includes an output waveguide 504 to provide an additional output laser beam of the desired wavelength. The additional output laser beam is reflected from diffraction grating 110 at a mirror-reflection angle from gain waveguide 102. Output waveguide 504 is spatially present at the mirror-reflection angle to receive the additional output laser beam of the desired wavelength. Output waveguide 504 then provides the additional output laser beam as the additional output of wavelength tunable laser 100, which can be used for waveguide monitoring, wavelength locking and other purposes.

Figure 6:
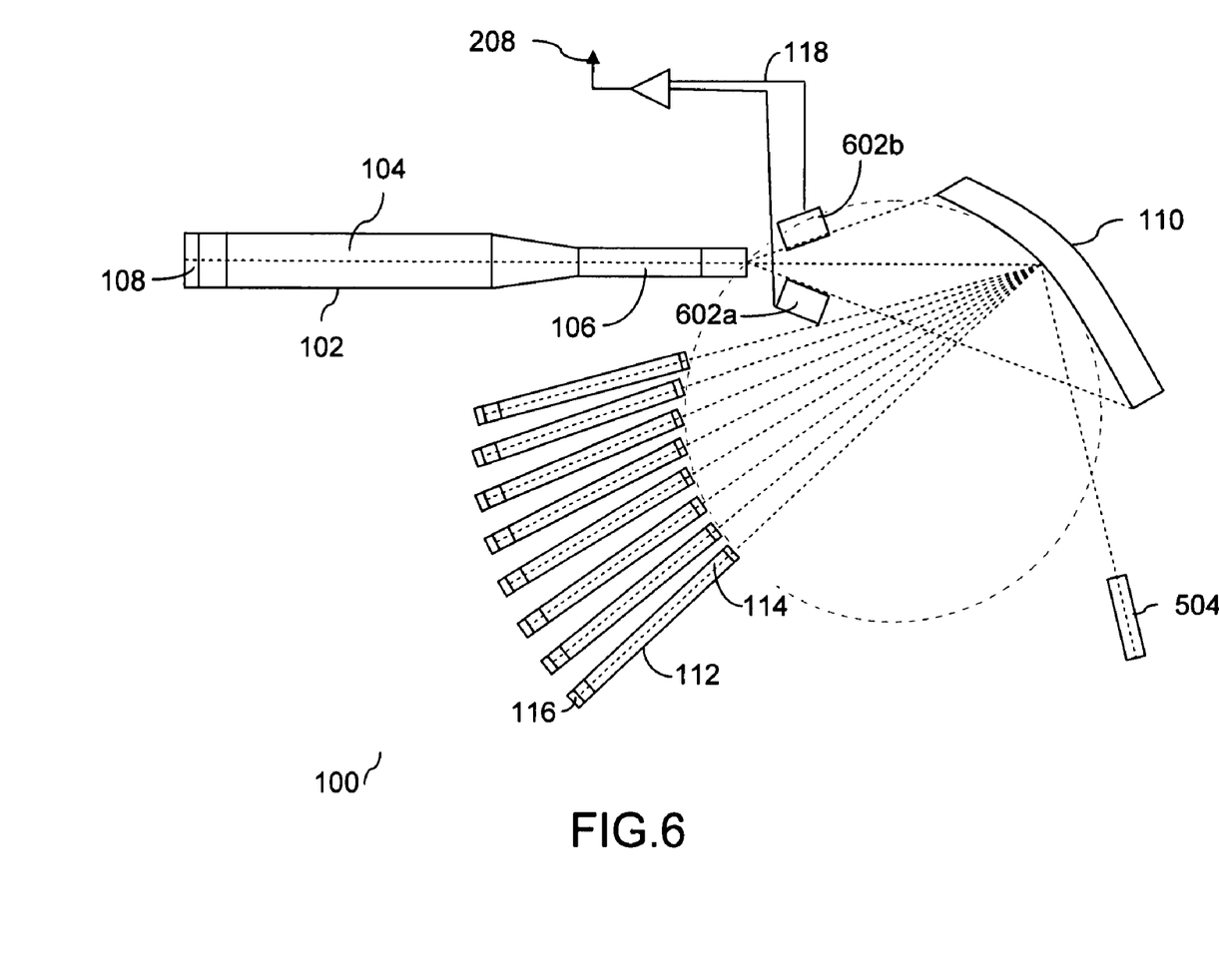
FIG. 6 is another diagram of a wavelength tunable laser, in accordance with an exemplary embodiment of the invention.

FIG. 6 is yet another diagram of wavelength tunable laser 100, in accordance with an exemplary embodiment of the invention. Phase-shifting section 106 can shift the phase of the received laser beam to nullify any cavity-mode frequency offset, based on error signal 208 received from phase detector 118. Phase detector 118 includes a pair of detectors 602a and 602b that are placed at the edge of the optical beam. Pair of detectors 602a and 602b can absorb a small percentage of the diffracted and received beam to and from the grating to the waveguide. Error signal 208 generated by the phase detector is proportional to the cavity-mode frequency offset. This error signal 208 can be feedback to phase-shifting section 106, to nullify the cavity-mode frequency offset.

Figure 7:
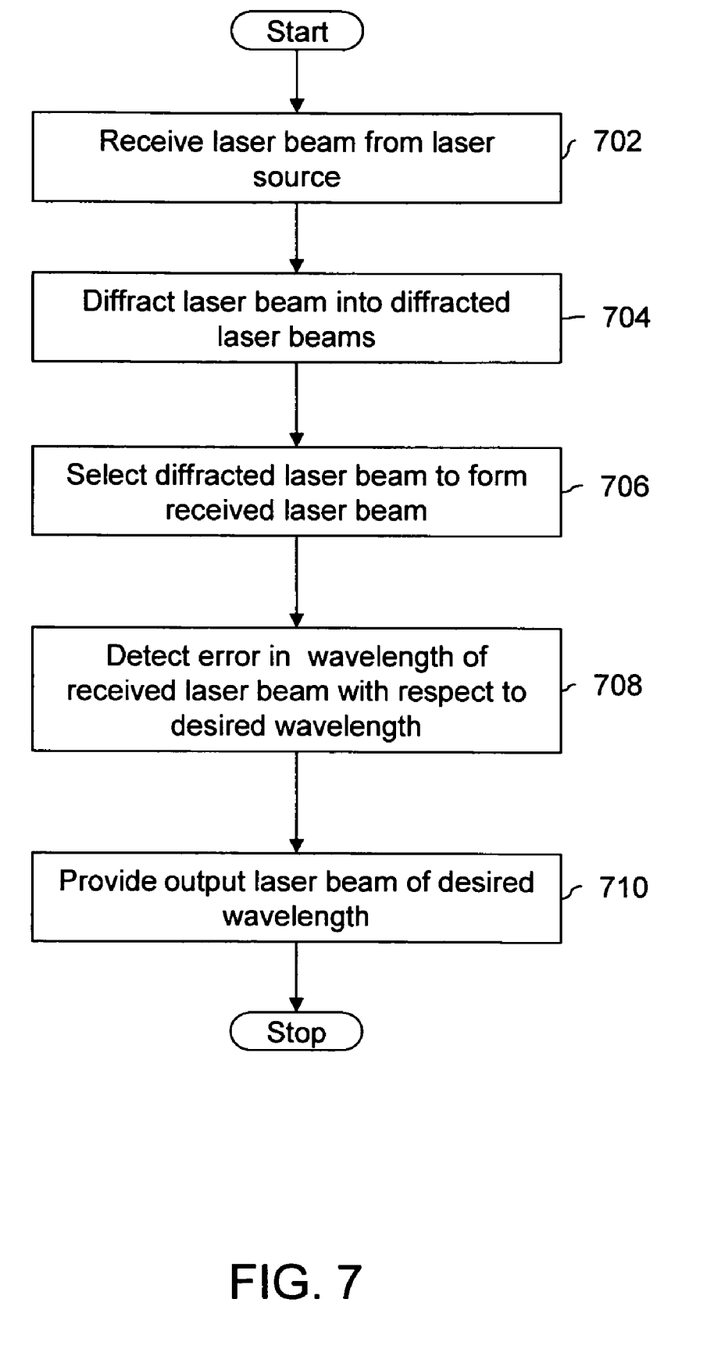
FIG. 7 is a flowchart illustrating a method for tuning a laser beam to a desired wavelength, in accordance with an exemplary embodiment of the invention.

FIG. 7 is a flowchart illustrating a method for tuning the laser beam to the desired wavelength, in accordance with an exemplary embodiment of the invention. The method of FIG. 7 will be explained in conjunction with FIGS. 1, 2, 3, 4, 5 and 6, and appropriate references, wherever required, will be made to the elements illustrated in FIGS. 1, 2, 3, 4 and 5. According to one embodiment, the wavelength of the laser beam to be tuned can span over a wavelength range. For example, if the laser beam is said to be of 1550 nm wavelength, the laser beam can actually include laser beams, which have their wavelengths between 1534 (1550−16) nm and 1566 (1550+16) nm, i.e., spanning over 32 nm and centered at 1550 nm. The method for tuning the laser beam provides an output laser beam of the desired wavelength, wherein the wavelength of the laser beam is tuned to produce the output laser beam. In one present embodiment, the output laser beam can have the desired wavelength selected between 1534 nm and 1566 nm, i.e., over 32 nm range of wavelengths centered at 1550 nm.

The laser beam reflected by first mirror 108 first passes through gain waveguide 102. In one embodiment, gain waveguide 102 can be a laser source that provides the laser beam to diffraction grating 110. Gain amplifying section 104 of gain waveguide 102 amplifies the laser beam to provide optical gain to the laser beam. The laser beam then exits gain waveguide 102 through slit 206 and is received by diffraction grating 110. At step 702, diffraction grating 110 receives the laser beam that exits from slit 206 of gain waveguide 102. At step 704, diffraction grating 110 diffracts the laser beam into a plurality of diffracted laser beams. Each of the diffracted laser beams is of a specific wavelength. In other words, the wavelength of each of the diffracted laser beams is different from the other diffracted wavelengths. Further, each of the diffracted laser beams, with a different wavelength, is diffracted in different specific spatial directions. For exemplary purposes, the laser beam in FIG. 1 is illustrated to be diffracted into eight diffracted laser beams, with the specific wavelength of the diffracted laser beam lying in the range of 4 nm. For each of the plurality of diffracted laser beams, one of the feedback waveguide is spatially present in the specific spatial direction of the diffracted laser beam. Each of the diffracted laser beams can enter one of the feedback waveguide that corresponds to its specific spatial direction.

At step 706, the received laser beam is obtained from the plurality of diffracted laser beams. The diffracted laser beam enters feedback waveguide 112 through slit 406. On receiving the diffracted laser beam, absorber section 114 of feedback waveguide 112 is pumped to transparency, to select the diffracted laser beam of the specific wavelength from the plurality of diffracted laser beams. In one embodiment, absorber section 114 of feedback waveguide 112 is pumped to transparency, to select one diffracted laser beam of the plurality of diffracted laser beams. All other diffracted laser beams of the plurality of diffracted laser beams are absorbed by their corresponding absorber sections. Therefore, according to one embodiment, the wavelength of the laser beam, which lies in the range of 32 nm, is tuned to the diffracted laser beam having the specific wavelength lying in the range of 4 nm.

Further, the diffracted laser beam can be further tuned to the desired wavelength by thermal tuning. According to one embodiment, the wavelength of the diffracted laser beam lies in the range of 4 nm, and through thermal tuning, the desired wavelength can be achieved. The thermal tuning of the diffracted laser beam is controlled by the temperature-controlled airtight module that encloses wavelength tunable laser 100. According to one embodiment, wavelength tunable laser 100 can have a set of eight feedback waveguides and each of them can be spatially present so that the eight diffracted laser beams have the 32 nm wavelength range (centered at 1550 nm, for example). The wavelength spacing between any two adjacent feedback waveguides will then be 4 nm. According to this embodiment, the temperature-tuning rate of wavelength tunable laser 100 is 0.12 nm/° C. and, therefore; with the temperature tuning of around 33° C., the diffracted laser beam can be tuned over 4 nm range. Therefore, by selecting the diffracted laser beam corresponding to feedback waveguide 112, and thermal tuning the diffracted laser beam over the 4 nm range, the diffracted laser beam of the desired wavelength can be obtained.

The diffracted laser beam, selected from the plurality of diffracted laser beams and then thermally tuned to achieve the desired wavelength, is then reflected from second mirror 116. Second mirror 116 precedes feedback waveguide 112 and can only receive the diffracted laser beam when absorber section 114 is pumped to transparency. The reflected laser beam is obtained by reflecting the diffracted laser beam from second mirror 116. After reflection from second mirror 116, the reflected laser beam passes through feedback waveguide 112 and exits feedback waveguide 112 through slit 406. The reflected laser beam then follows the path of the diffracted laser beam, but in the opposite direction. The diffracted laser beam propagates from diffraction grating 110 to second mirror 116, but the reflected laser beam propagates from second mirror 116 to diffraction grating 110. The reflected laser beam is then diffracted by diffraction grating 110 to gain waveguide 102, to obtain the received laser beam.

Apart from the reflected laser beam, the received laser beam having the cavity-mode wavelength can also be present due to the Fabry-Perot resonance phenomenon, as described in FIG. 2. The cavity-mode wavelength is different from the desired wavelength and this results in the cavity-mode frequency offset between the received laser beams of these two wavelengths. At step 708, in conjunction with FIGS. 1, 2 and 5, phase detector 118 detects the error in the wavelength of the received laser beam with respect to the desired wavelength. Phase detector 118 includes pair of detectors 210a and 210b that is placed at an equal distance from slit 206, according to one embodiment. In this embodiment, in conjunction with FIGS. 1 and 2, slit 206 can act as a beam splitter that can reflect a small percentage of the received beam to pair of detectors 210a and 210b of phase detector 118. In another embodiment, in conjunction with FIGS. 2 and 5, pair of detectors 210a and 210b of phase detector 118 is placed at an equal distance from beam splitter 502, which reflects a small percentage of the received beam to pair of detectors 210a and 210b of phase detector 118. In yet another embodiment, in conjunction with FIG. 6, pair of detectors 602a and 602b of phase detector 118 is placed at the edge of the optical beam going from diffraction grating 110 towards gain amplifying section 104. When the wavelength of the received laser beam is the same as the desired wavelength, the received laser beam will hit the center of slit 206, and the two detectors of phase detector 118 will receive equal signals. If the wavelength of the received laser beam is different from the desired wavelength, the received laser beam will hit to one side of slit 206, resulting in one of the detectors having a higher output than the other. The two outputs of this detector pair of phase detector 118 are then subtracted from each other to provide error signal 208. Error signal 208 is therefore proportional to the cavity-mode frequency offset. This error signal 208 can then be sent as feedback signal to control phase-shifting section 106. On receiving error signal 208, phase-shifting section 106 is injected with electric current, to phase-shift the received laser beam as according to error signal 208. This phase-shifting of the received laser beam nullifies the cavity-mode frequency offset. After phase-shifting the received laser beam (if required), the output laser beam of the desired wavelength is obtained. At step 710, the output laser beam of the desired wavelength is provided as output from wavelength tunable laser 100. In one embodiment, in conjunction with FIG. 5, output waveguide 504 is used to provide the output laser beam of the desired wavelength. In another embodiment, first mirror 108 can provide the output laser beam as output from wavelength tunable laser 100. The output laser beam can also be amplified by gain amplifying section 104 before it is provided as output from wavelength tunable laser 100.

Figure 8:
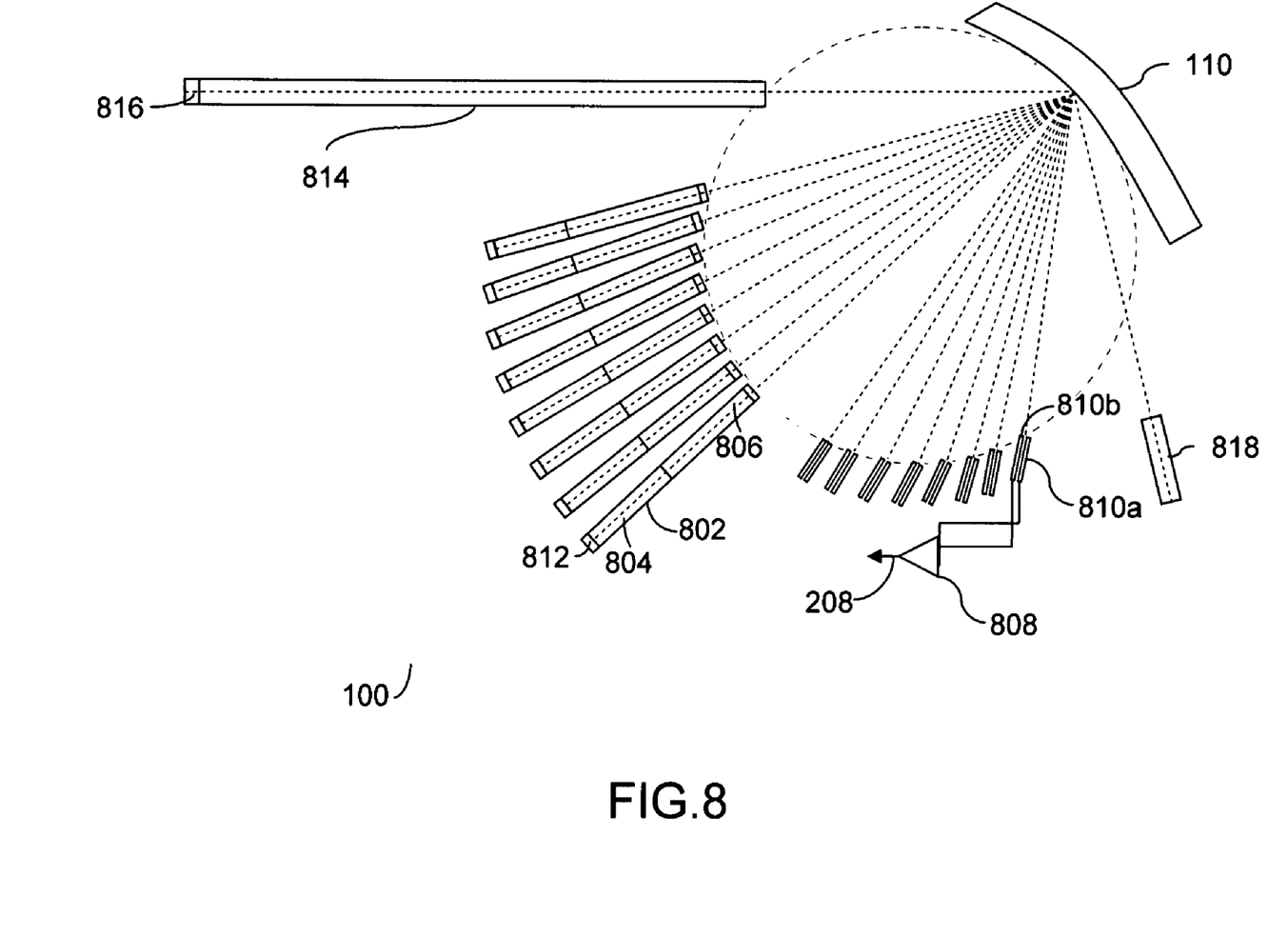
FIG. 8 is another diagram of a wavelength tunable laser, in accordance with an exemplary embodiment of the invention.

FIG. 8 is another diagram of wavelength tunable laser 100, in accordance with an exemplary embodiment of the invention. Wavelength tunable laser 100 is a monolithically integrated laser, based on the chip-scale WDM technology with nanosecond tuning speed. Wavelength tunable laser 100 can be fabricated on a single semiconductor chip. Wavelength tunable laser 100 includes at least one gain waveguide 802, wherein gain waveguide 802 is spatially present in a specific direction. In one embodiment, gain waveguide 802 is structurally and functionally the same as gain waveguide 102. Each of the gain waveguide 802 can be individually selected by injecting electric current into it.

Gain waveguide 802 includes a gain amplifying section 804 and a phase-shifting section 806. Gain amplifying section 804 provides optical gain to a laser beam by amplifying it. Phase-shifting section 806 can shift the phase of the received laser beam to nullify any cavity-mode frequency offset, based on error signal 208 received from one of plurality of phase detectors 808. Each of the gain waveguide 802 corresponds to one of plurality of phase detectors 808. Phase detector 808 includes a pair of detectors 810a and 810b. Gain waveguide 802 precedes a second mirror 812 that can reflect a laser beam. In one embodiment, second mirror 812 can be a high reflectivity metal or dielectric coated reflector. The laser beam reflected from second mirror 812, passing through gain waveguide 802, propagates to diffraction grating 110. Diffraction grating 110 is used to diffract the laser beam into a diffracted laser beam. The diffracted laser beam has a specific wavelength and is diffracted to a passive waveguide 814. Passive waveguide 814 also includes a core and a cladding, as described for feedback waveguide 112 in FIG. 4. Passive waveguide 814 precedes a first mirror 816. First mirror 816 can be a metal-coated reflector that can provide a reflected laser beam from the diffracted laser beam by reflecting the diffracted laser beam. In one embodiment, first mirror 816 is a wafer-cleaved facet that can provide the output laser beam. The reflected laser beam is reflected back to second mirror 812 through diffraction grating 110 and gain waveguide 802. Therefore, a laser cavity is formed between second mirror 812 and first mirror 816 for laser propagation and wavelength tuning of the laser beam.

The part of the reflected laser beam that propagates through the center of passive waveguide 814 is considered as a fundamental mode of the reflected laser beam. However, there are other modes related to the propagation of the reflected laser beam through passive waveguide 814. The other modes, including the lower-order mode, take more transverse paths than the fundamental mode, striking and reflecting between the core and the cladding of passive waveguide 814. According to one embodiment, low-order modes take parallel transverse paths with respect to the fundamental mode. A received laser beam is obtained when the reflected laser beam is diffracted by diffraction grating 110 to gain waveguide 802. The received laser beam can also have the lower-order mode with respect to the fundamental mode of the received laser beam. The lower-order mode of the received laser beam is diffracted spatially to a different spatial direction, as compared to the specific direction of gain waveguide 802. However, the spatial direction of the lower-order mode of the received laser beam is spatially related to the specific direction of gain waveguide 802. Phase detector 808 is spatially present at the specific direction of the lower-order mode of the received laser beam.

Phase detector 808 detects the error in the wavelength of the received laser beam with respect to the desired wavelength. Phase detector 808 also generates error signal 208 to identify the error in the wavelength of the received laser beam. This error signal 208 can be feedback to phase-shifting section 806, to nullify the cavity-mode frequency offset. After phase-shifting the received laser beam (if required), the output laser beam of the desired wavelength is obtained. The output laser beam of the desired wavelength is then provided as output from wavelength tunable laser 100. In one embodiment, first mirror 816 can provide the output laser beam as output from wavelength tunable laser 100. In one embodiment, wavelength tunable laser 100 can be used for multiple wavelength channel transmission by selecting more than one gain waveguide 802. More than one gain waveguide 802 can be selected to transmit a plurality of laser beams by injecting electric current into each of them. Therefore, more than one gain waveguide 802 can be used to transmit a plurality of laser beams through passive waveguide 814 and first mirror 816.

Wavelength tunable laser 100 also includes a wavelength locker waveguide 818 that provides a wavelength-locking laser beam. Wavelength locker waveguide 818 is spatially present at a mirror-reflection angle of the laser beam. The laser beam can be reflected from diffraction grating 110 at a mirror-reflection angle. In one embodiment, wavelength locker waveguide 818 is used to determine the wavelengths of the plurality of laser beams that are transmitted through first mirror 816 for multiple wavelength channel transmission. In one embodiment, the wavelength-locking laser beam is of the same wavelength as that of the laser beam. Wavelength locker waveguide 818 is spatially present at the mirror-reflection angle to receive the laser beam and provide the wavelength-locking laser beam. The wavelength of the laser beam of the plurality of laser beams can be used to determine the wavelengths of each of the plurality of laser beams, since the wavelengths of the plurality of laser beams lie within a set of ranges. For example, if the wavelength of the laser beam propagating through gain waveguide 802 is 1550 nm (with wavelengths lying over 4 nm range centered at 1550 nm, i.e., between 1548 nm and 1552 nm), another laser beam of 1554 nm wavelength (with wavelengths lying over 4 nm range centered at 1554 nm, i.e., between 1552 nm and 1556 nm) will propagate through an adjacent gain waveguide. Correspondingly, the wavelengths of each of the plurality of laser beams can be determined by determining the wavelength of the laser beam by wavelength locker waveguide 818.

Figure 9:
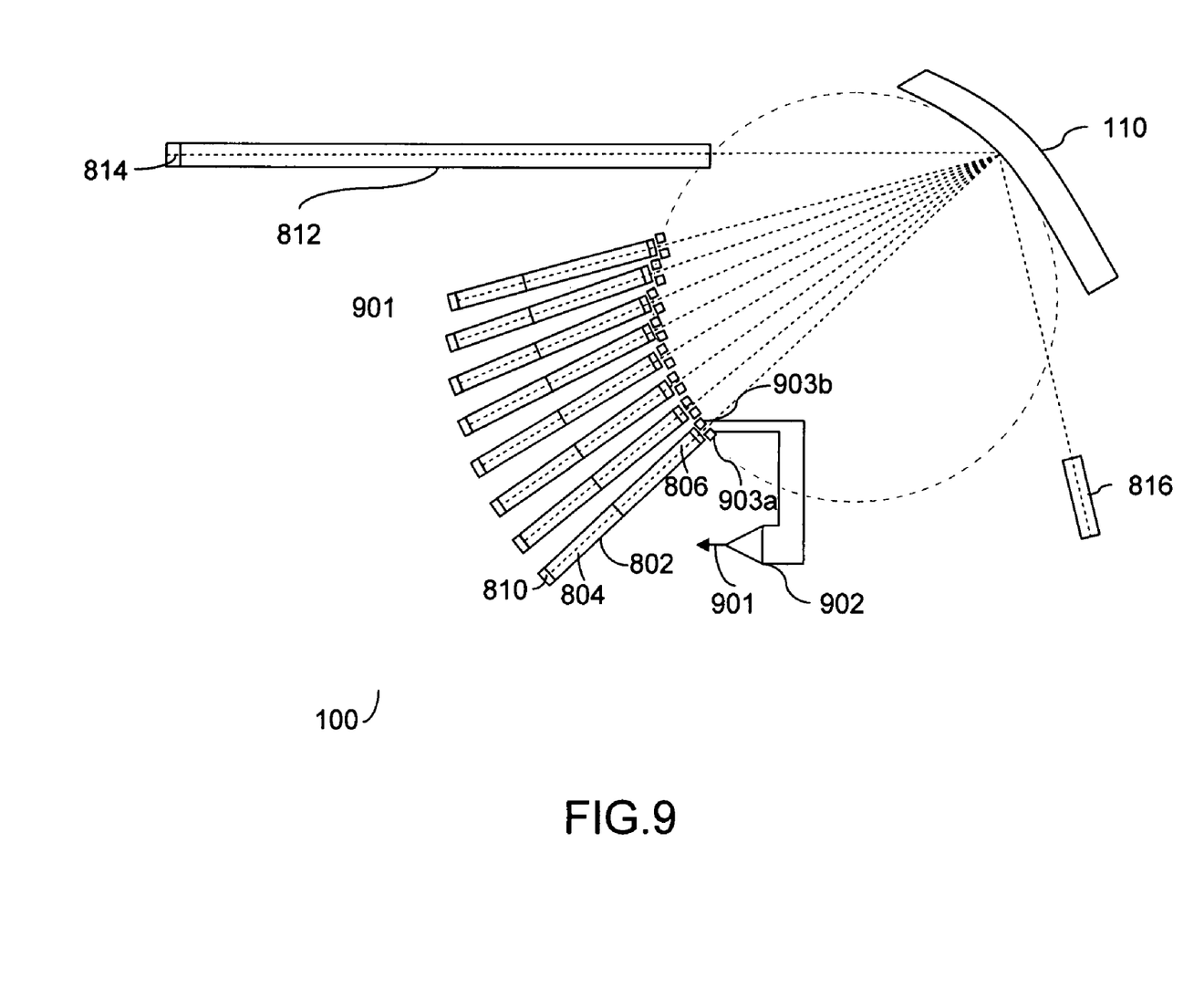
FIG. 9 is another diagram of a wavelength tunable laser, in accordance with an exemplary embodiment of the invention. Skilled artisans will appreciate that the elements in the figures are illustrated for simplicity and clarity, and have not necessarily been drawn to scale. For example, the dimensions of some of the elements in the figures may be exaggerated, relative to the other elements, to help in improving understanding of the embodiments of the present invention.

FIG. 9 is yet another diagram of wavelength tunable laser 100, in accordance with an exemplary embodiment of the invention. Phase-shifting section 806 can shift the phase of the received laser beam to nullify any cavity-mode frequency offset, based on error signal 901 received from phase detector 902. Phase detector 902 includes a pair of detectors 903a and 903b that are placed at the edge of the optical beam. Pair of detectors 903a and 903b can absorb a small percentage of the diffracted and received beam to and from the grating to the waveguide. Error signal 901 generated by the phase detector is proportional to the cavity-mode frequency offset. This error signal 901 can be feedback to phase-shifting section 806, to nullify the cavity-mode frequency offset.

Various advantages of wavelength tunable laser 100 enable its use for a wide variety of applications, including DWDM networks, WDM on chips, instrumentations, and analog/RF photonics. DWDM networks require tunable lasers with low power consumption, simple control circuit, and wide tunability. For general WDM-on-chips applications, it is desirable that monolithically integrated tunable lasers have simple control circuitry and low power consumption. Scientific instruments or network diagnostic equipment areas also require tunable lasers with high output, wide tunability, and narrow linewidth. Analog or RF photonics require tunable lasers with high output, wide tunability, narrow linewidth, and low cost.

Various embodiments of the present invention provide a wavelength tunable laser 100 that is a monolithically integrated laser, based on the chip-scale WDM technology with nanosecond tuning speed. It can be fabricated on a single InP semiconductor chip. In one embodiment, wavelength tunable laser 100 includes an integrated computationally generated, aberration-corrected diffraction grating 110. Diffraction grating 110 diffracts laser beams of different wavelengths to different spatial directions. This enables the realization of a simple phase detector 118 that does not require a complex control circuit to detect an error in the laser beam with respect to the desired wavelength. By turning on different feedback waveguides with thermal tuning, a widely tunable laser can be realized. The current requirement of the wavelength tunable laser 100 is also low, since in one exemplary embodiment, it requires only 170 mA of electrical current injection (150 mA for gain amplifying section 104 and 10 mA for each phase-shifting section 106 and absorber section 114). This reduces the power consumption of wavelength tunable laser 100 and thereby, the cost of operation. Therefore, wavelength tunable laser 100 offers wide tunability, high spectral purity, narrow linewidth, small channel spacing, low power consumption and simple control electronics with low costs, and therefore satisfies the requirements of the application areas mentioned above.

The control circuitry of the system for a wavelength tunable laser, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps constituting the method of the present invention.

The computer system comprises a computer, an input device, a display unit and the Internet. The computer further comprises a microprocessor. The microprocessor is connected to a communication bus. The computer also includes a memory. The memory may be Random Access Memory (RAM) or Read Only Memory (ROM). The computer system further comprises a storage device, which may be a hard disk drive or a removable storage drive, such as a floppy disk drive, an optical disk drive, and the like. The storage device may also have other similar means of loading computer programs or other instructions to the computer system. The computer system also includes a communication unit. The communication unit enables the computer to connect to other databases and the Internet through an Input/Output (I/O) interface, enabling transfer and reception of data from other databases. The communication unit may include a modem, an Ethernet card or any other similar device that enables the computer system to connect to databases and networks, such as LAN, MAN, WAN and the Internet. The computer system facilitates inputs from a user through an input device, which is accessible to the system through an I/O interface.

The computer system executes a set of instructions stored in one or more storage elements, to process the input data. The storage elements may also hold data or other information, as desired. The storage element may be in the form of an information source or a physical memory element present in the processing machine.

The programmable instructions may include various commands that instruct the processing machine to perform specific tasks, such as the steps that constitute the method of the present invention. The method and systems described can also be implemented using only software programming or hardware, or by a varying combination of the two techniques. The present invention is independent of the programming language used and the operating system in the computers. The instructions for the invention can be written in all programming languages including, but not limited to, 'C', 'C++', 'Visual C++', and 'Visual Basic'. Further, the software may be in the form of a collection of separate programs, a program module with a large program or a portion of a program module, as described in the present invention. The software may also include modular programming in the form of object-oriented programming. The processing of the input data by the processing machine may be in response to user commands, results of previous processing or a request made by another processing machine. The invention can also be implemented in all operating systems and platforms including, but not limited to, 'Unix', DOS', and 'Linux'.

The programmable instructions can be stored and transmitted on computer-readable medium. The programmable instructions can also be transmitted by data signals across a carrier wave. The present invention can also be embodied in a computer program product comprising a computer-readable medium, the product capable of implementing the methods and systems described above, or the numerous possible variations thereof.

While the preferred embodiments and advantages of the invention have been illustrated and described, it will be clear that the invention is not limited to these embodiments and advantages only. Numerous modifications, changes, variations, substitutions and equivalents will be apparent to those skilled in the art without departing from the spirit and scope of the invention as described in the claims.

What is claimed is:

1. A monolithically integrated laser device comprising:
   a. a first mirror;
   b. a diffraction grating for diffracting a laser beam into a plurality of diffracted laser beams, the laser beam being received from the first mirror, wherein each of the plurality of diffracted laser beams is directed to a specific spatial direction, each diffracted laser beam having a specific wavelength;
   c. a plurality of feedback waveguides, wherein each of the plurality of feedback waveguides is present in the corresponding specific spatial direction, wherein a feedback waveguide from the plurality of feedback waveguides is selected to receive a diffracted laser beam of a desired wavelength from the plurality of diffracted laser beams;
   d. a plurality of second mirrors, wherein each of the plurality of feedback waveguides precedes a corresponding second mirror, wherein a second mirror corresponding to the selected feedback waveguide reflecting the diffracted laser beam of the desired wavelength; and
   e. a semiconductor substrate in which the laser beam, the plurality of diffracted laser beams and the reflected laser beam from the second mirror is confined to propagate within a plane parallel to the semiconductor substrate, wherein the first mirror, the diffraction grating, the plurality of feedback waveguides and the plurality of second mirrors are fabricated on the semiconductor substrate.

2. The laser device of claim 1 further comprising a phase detector for detecting an error in a wavelength of a received laser beam with respect to the desired wavelength, wherein the phase detector generates an error signal to identify the error in the wavelength of the received laser beam.

3. The laser device of claim 2 further comprising a gain waveguide, wherein the gain waveguide precedes the first mirror, the gain waveguide including:
   a. a gain amplifying section to amplify the laser beam; and
   b. a phase-shifting section for shifting phase of the received laser beam based on the error signal received from the phase detector, wherein the wavelength of the received laser beam differs from the desired wavelength.

4. The laser device of claim 1 further comprising a secondary output waveguide to provide an output laser beam of the desired wavelength.

5. The secondary output waveguide of claim 4, wherein the secondary output waveguide is spatially present at a mirror-reflection angle of the output laser beam of the desired wavelength, where the output laser beam is reflected by the diffraction grating.

6. The device of claim 1, wherein the first mirror is a wafer-cleaved facet that provides an output laser beam of the desired wavelength.

7. The laser device of claim 1 being enclosed in a temperature-controlled airtight module, wherein the temperature-controlled airtight module enables thermal tuning of the diffracted laser beam.

8. The laser device of claim 1, wherein each of the plurality of feedback waveguides comprises an absorber section, wherein the absorber section corresponding to the feedback waveguide is pumped to transparency to receive the diffracted laser beam of the desired wavelength.

9. The laser device of claim 1, wherein the diffraction grating is in the shape of a concave curve.

10. The laser device of claim 1, wherein the diffraction grating is a super-compact grating.

11. The laser device of claim 1 further comprising a beam splitter that reflects the received laser beam to the phase detector.

12. The laser device of claim 3, wherein the phase detector is positioned at the edge of the phase shifting section.

13. A monolithically integrated laser device comprising:
   a. a first mirror;
   b. a diffraction grating for diffracting one or more laser beams into a diffracted laser beam, the diffracted laser beam being propagated towards the first mirror, wherein each of the one or more laser beams has a specific wavelength;
   c. a plurality of gain waveguides, wherein each of the plurality of gain waveguides is spatially present in a specific direction, wherein one or more of the plurality of gain waveguides is selected, wherein each selected gain waveguide transmits a laser beam of the one or more laser beams, wherein each gain waveguide is selected based on a corresponding desired wavelength;
   d. a plurality of second mirrors, wherein each of the plurality of gain waveguides precedes a corresponding second mirror, each laser beam of the one or more transmitted laser beams being reflected from a corresponding second mirror associated with the corresponding selected gain waveguide; and
   e. a semiconductor substrate in which the diffracted laser beam and the one or more laser beams is confined to propagate within a plane parallel to the semiconductor substrate, wherein the first mirror, the diffraction grating, the plurality of gain waveguides and the plurality of second mirrors are fabricated on the semiconductor substrate.

14. The laser device of claim 13 further comprising at least one phase detector, wherein the at least one phase detector detects an error in a wavelength of the received laser beam with respect to a desired wavelength, wherein the at least one phase detector generates an error signal to identify the error in the wavelength of the received laser beam.

15. The laser device of claim 13 further comprising a passive waveguide, wherein the passive waveguide precedes the first mirror, the passive waveguide providing an output laser beam to the first mirror.

16. The laser device of claim 14, wherein each of the plurality of gain waveguides comprises:
   a. a gain amplifying section to amplify the laser beam; and
   b. a phase-shifting section for shifting phase of the received one or more laser beams based on the error signal received from the phase detector, wherein the wavelength of the received one or more laser beams differs from the desired wavelength.

17. The laser device of claim 13, wherein the first mirror is a wafer-cleaved facet that provides an output laser beam of the desired wavelength.

18. The laser device of claim 13 being enclosed in a temperature-controlled airtight module, wherein the temperature-controlled airtight module enables thermal tuning of the diffracted laser beam.

19. The laser device of claim 13, wherein the diffraction grating is in the shape of a concave curve.

20. The laser device of claim 14, wherein the at least one phase detector is spatially present in a specific direction corresponding to the plurality of gain waveguides.

21. A method for tuning a monolithically integrated laser to a one or more desired wavelengths comprising the steps of:
   a. receiving a laser beam from a laser source;
   b. diffracting the laser beam into a plurality of diffracted laser beams, wherein the plurality of diffracted laser beams of specific wavelengths are diffracted to specific spatial directions;
   c. selecting one or more diffracted laser beams from the plurality of diffracted laser beams;
   d. detecting an error in a wavelength corresponding to each of the selected one or more diffracted laser beams with respect to the one or more desired wavelengths; and
   e. providing an output laser beam of the one or more desired wavelengths.

22. The method of claim 21, wherein the step of selecting the one or more diffracted laser beams comprises:
   a. selecting one or more waveguides; and
   b. reflecting the one or more diffracted laser beams by one or more second mirrors, wherein each of the one or more waveguides precedes a corresponding second mirror.

23. The method of claim 22 further comprising the step of pumping an absorber section of the one or more waveguides to transparency to select a waveguide.

24. The method of claim 21 further comprising the step of thermally tuning the one or more diffracted laser beams.

25. The method of claim 21, wherein the step of detecting the error in the one or more wavelengths of the one or more diffracted laser beams further comprises:
   generating an error signal indicating an error in the one or more wavelengths of the one or more diffracted laser beams if the one or more wavelengths of the one or more diffracted laser beams differs from the one or more desired wavelengths; and
   sending the error signal to a phase-shifting section.

26. The method of claim 25, further comprising the step of shifting the phase of the one or more diffracted laser beams, based on the error signal sent to the phase section.

27. The method of claim 21, further comprising the step of amplifying the output laser beam.

28. The laser device of claim 1, wherein the semiconductor substrate is made from at least one of Si, InP, GaAs, GaN, and Ge.

29. The laser device of claim 13, wherein the semiconductor substrate is made from at least one of Si, InP, GaAs, GaN, and Ge.

* * * * *